United States Patent
Moon et al.

(10) Patent No.: US 9,484,129 B2
(45) Date of Patent: Nov. 1, 2016

(54) MANUFACTURING METHOD OF SUPERCONDUCTING WIRE AND SUPERCONDUCTING WIRE MADE THEREBY

(71) Applicant: SUNAM CO., LTD., Anseong-si, Gyeonggi-do (KR)

(72) Inventors: Seung Hyun Moon, Seongnam-si (KR); Woo Suk Chung, Yongin-si (KR); Jae Hun Lee, Osan-si (KR); KyuHan Choi, Hwaseong-si (KR); DeaWon Song, Ansan-si (KR); ByeongJoo Kim, Ansan-si (KR); SangJun Ahn, Hwaseong-si (KR)

(73) Assignee: SUNAM CO., LTD., Anseong-Si, Gyeonggi-Do (KR)

( * ) Notice: Subject to any disclaimer, the term of this patent is extended or adjusted under 35 U.S.C. 154(b) by 65 days.

(21) Appl. No.: 14/424,879

(22) PCT Filed: Aug. 29, 2013

(86) PCT No.: PCT/KR2013/007765
§ 371 (c)(1),
(2) Date: Feb. 27, 2015

(87) PCT Pub. No.: WO2014/035155
PCT Pub. Date: Mar. 6, 2014

(65) Prior Publication Data
US 2015/0228380 A1    Aug. 13, 2015

(30) Foreign Application Priority Data

Aug. 29, 2012 (KR) .................... 10-2012-0095110
Aug. 19, 2013 (KR) .................... 10-2013-0098075

(51) Int. Cl.
*H01B 12/00* (2006.01)
*H01L 39/14* (2006.01)
(Continued)

(52) U.S. Cl.
CPC .......... *H01B 12/06* (2013.01); *H01B 13/0016* (2013.01); *H01B 13/0036* (2013.01); *H01B 13/222* (2013.01); *H01B 13/228* (2013.01); *H01L 39/143* (2013.01); *H01L 39/248* (2013.01)

(58) Field of Classification Search
CPC .............. H01B 12/06; H01B 13/0016; H01B 13/0036; H01L 39/143; H01L 39/248
See application file for complete search history.

(56) References Cited

U.S. PATENT DOCUMENTS

| 2010/0261058 A1* | 10/2010 | Lopatin | ................. | H01M 4/133 |
| | | | | 429/212 |
| 2010/0261071 A1* | 10/2010 | Lopatin | ................. | H01M 4/133 |
| | | | | 429/345 |

(Continued)

FOREIGN PATENT DOCUMENTS

| JP | 2012-043734 A | 3/2012 |
| KR | 10-0750664 B1 | 8/2007 |

(Continued)

OTHER PUBLICATIONS

Lee, at al., "Application of Reflow Soldering Method for Laminated High Temperature Superconductor Tapes", Superconductivity and Cryogenics, vol. 12 No. 2,(2010), pp. 9-12.

*Primary Examiner* — Colleen Dunn
(74) *Attorney, Agent, or Firm* — Lee & Morse, P.C.

(57) ABSTRACT

Provided is a method of manufacturing a superconducting wire. A superconducting tape having an outer surface is provided, a copper layer is formed on the outer surface of the superconducting tape, and first metal tape and second metal tape are respectively attached on a first surface and a second surface of the superconducting tape on which the copper layer is formed.

24 Claims, 6 Drawing Sheets (51) Int. Cl.
*H01B 12/06* (2006.01)
*H01B 13/00* (2006.01)
*H01B 13/22* (2006.01)
*H01L 39/24* (2006.01)

(56) References Cited

U.S. PATENT DOCUMENTS

2012/0065074 A1  3/2012  Xie et al.

2012/0329658 A1  12/2012  Moon et al.

FOREIGN PATENT DOCUMENTS

| KR | 10-2009-0102170 A | 9/2009 |
| KR | 10-2011-0134548 A | 12/2011 |
| KR | 10-2012-0013383 A | 2/2012 |

* cited by examiner

Figure 11b

MANUFACTURING METHOD OF SUPERCONDUCTING WIRE AND SUPERCONDUCTING WIRE MADE THEREBY

TECHNICAL FIELD

The present invention disclosed herein relates to a superconducting wire.

BACKGROUND ART

Since power devices using a superconducting wire may enhance efficiency without loss due to resistance and allow a larger amount of current to flow through a small area, the superconducting wire has advantages enabling the miniaturization and lightweight of the power devices. Recently, a second generation high temperature superconducting wire (Coated Conductor) including a superconducting film on a metal substrate or on a thin buffer layer including a biaxially aligned textured structure has been studied. Compared to a metal conductor, the second generation high temperature superconducting wire can transmit much more electric current per unit area of its cross-section. The second generation high temperature superconducting wire may be used in superconducting power transmission and distribution cable with low power loss, a magnetic resonance imaging (MRI), a magnetic levitation train, a superconducting propulsion ship, etc.

DISCLOSURE

Technical Problem

The present invention provides a lamination for a superconducting wire.

Technical Solution

Embodiments of the inventive concept provide methods of manufacturing a superconducting wire. The methods may include: providing a superconducting tape having an outer surface defined by a first surface, a second surface opposing the first surface, and both side surfaces connecting the first surface and the second surface; forming a copper layer on the outer surface of the superconducting tape; and respectively attaching a first metal tape and a second metal tape on the first surface and the second surface of the superconducting tape on which the copper layer is formed, wherein the forming of the copper layer includes: forming a copper protecting layer using a physical deposition method so as to cover the first surface, the second surface and the side surfaces; and forming a copper stabilizing layer on the copper protecting layer using an electroplating method.

In some embodiments, the copper protecting layer may be formed by a sputtering process, and the superconducting tape may be twisted during the sputtering process such that the copper protecting layer completely covers the first surface, the second surface and the side surfaces of the superconducting tape.

In other embodiments, the copper protecting layer may be formed thinner on the side surfaces than on the first and second surfaces.

In still other embodiments, the forming of the copper stabilizing layer may include separating hydrogen ions generated in the electroplating method.

In even other embodiments, the electroplating method may use an electrolyzed sulfuric acid solution.

In yet other embodiments, the forming of the copper stabilizing layer may include baking the superconducting tape.

In further embodiments, the electroplating method may include supplying bubbles of oxygen, nitrogen, or air from a bottom of a plating member for electroplating.

In still further embodiments, the method may further include forming an oxidation preventing layer on the copper layer.

In even further embodiments, the oxidation preventing film may be a chromium-containing film or a silica-based inorganic compound film.

In yet further embodiments, the metal tapes may include stainless steel, copper, aluminum, nickel or alloys thereof.

In much further embodiments, the attaching of the first metal tape and the second metal tape may include providing a solder between the metal tapes and the superconducting tape on which the copper layer is formed.

In still much further embodiments, the attaching of the first metal tape and the second metal tape may include: providing the superconducting tape on which the copper layer is formed and the metal tapes between one pair of elastic bodies facing each other; and pressing the elastic bodies to remove a residue of the solder.

In even much further embodiments, the method may further include aligning one side of the copper layer on one side surface of the superconducting tape with one sides of the first and second metal tapes, before the attaching of the first and second metal tapes on the superconducting tape on which the copper layer is formed.

In yet much further embodiments, the thickness of the solder on the one side surface of the superconducting tape on which the copper layer is formed may be different from that on the other side surface of the superconducting tape on which the copper layer is formed.

In other embodiments, the thickness of the solder on the one side surface may be thinner than that on the other side surface.

In still other embodiments, the other sides of the first and second metal tapes may protrude from the other side of the copper layer on the other side surface of the superconducting tape.

The method may include: providing a superconducting tape having an outer surface defined by a first surface, a second surface opposing the first surface, and both side surfaces connecting the first surface and the second surface; covering a copper layer on the outer surface of the superconducting tape; providing the superconducting tape covered with the copper layer between a first metal tape and a second metal tape; aligning one side of the copper layer on one side surface of the superconducting tape with one sides of the first and second metal tapes; and attaching the first metal tape and the second metal tape on a first surface and a second surface of the superconducting tape covered with the copper layer, respectively.

In other embodiments, the thickness of the solder on the one side surface of the superconducting tape covered with the copper layer may be thinner than that on the other side surface of the superconducting tape covered with the copper layer.

In still other embodiments, the other sides of the first and second metal tapes may protrude from one side of the copper layer covering the other side surface of the superconducting tape.

Embodiments of the inventive concept provide superconducting wires. The superconducting wires may include: a superconducting tape having an outer surface defined by a first surface, a second surface opposing the first surface, and both side surfaces connecting the first surface and the second surface; a copper layer covering the outer surface of the superconducting tape; first and second metal tapes attached on the first surface and the second surface of the superconducting tape covered with the copper layer, respectively; and a solder between the first surface of the superconducting tape and the first metal tape, and between the second surface of the superconducting tape and the second metal tape, wherein the thickness of the solder on one side surface of the superconducting tape is different from that on the other side surface of the superconducting tape.

In some embodiments, the thickness of the solder on the one side surface may be thinner than that on the other side surface.

In other embodiments, the other sides of the first and second metal tapes may protrude from the other side of the copper layer on the other side surface of the superconducting tape.

In still other embodiments, one side of the copper layer covering the one side surface of the superconducting tape may be aligned with one sides of the first and second metal tapes.

In even other embodiments, the superconducting wire may further include an oxidation preventing layer on the copper layer.

Advantageous Effects

According to the inventive concept, a superconducting tape can be easily laminated.

MODE FOR INVENTION

Hereinafter, exemplary embodiments will be described in detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Also, since exemplary embodiments are described, reference numerals disclosed according to the sequence of description are not limited to the sequence.

Figure 1:
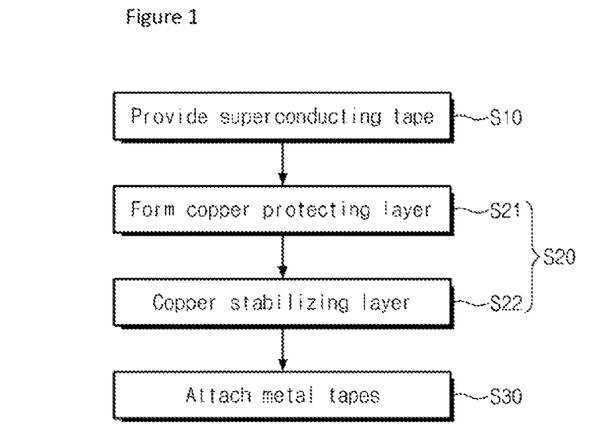
FIG. 1 is a flow diagram showing a method of manufacturing a superconducting wire according to the inventive concept.

FIG. 1 is a flow diagram showing a method of manufacturing a superconducting wire according to the inventive concept. Referring to FIG. 1, a superconducting tape having an outer surface is provided (S10). A copper layer is formed on the outer surface of the superconducting tape (S20). The forming of the copper layer may include forming a copper protecting layer using a physical deposition method (S21), and forming a copper stabilizing layer using an electroplating method on the copper protecting layer (S22). A first metal tape and a second metal tape are attached on a first surface of the superconducting tape on which the copper layer is formed, and on a second surface opposing the first surface, respectively (S30).

Figure 2:
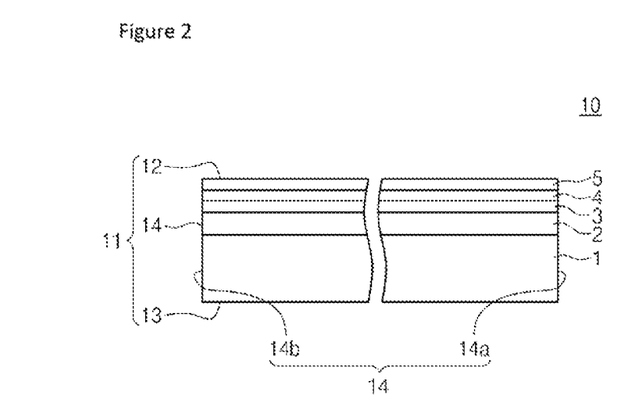
FIG. 2 conceptually illustrates a structure of a superconducting tape.

FIG. 2 conceptually illustrates a structure of a superconducting tape. Referring to FIGS. 1 and 2, a superconducting tape 10 having an outer surface 11 defined by a first surface 12, a second surface 13, and both side surfaces 14 is provided (S10). The second surface 13 opposes the first surface 12, and the both side surfaces 14 connect the first surface and the second surface. The both side surfaces 14 include one side surface 14a and the other side surface 14b. The superconducting tape 10 may include a substrate 1, and an IBAD layer 2, a buffer layer 3, a superconducting layer 4 and a protecting layer which are sequentially laminated on the substrate 1. The first surface 12 may be a top surface of the protecting layer 5, and the second surface 13 may be a bottom surface of the substrate 1.

The substrate 1 may have a biaxially aligned textured structure. The substrate 1 may be a metal substrate. The metal substrate may include a cubic lattice metal, such as nickel (Ni), nickel alloys (Ni—W, Ni—Cr, Ni—Cr—W, etc.), a stainless steel, silver (Ag), silver alloys, nickel-silver composites which are hot rolled. The substrate 1 may have a tape shape for a coated conductor.

The IBAD layer 2 may be formed on the substrate 1. The IBAD layer 2 may include a diffusion stop layer (e.g., $Al_2O_3$), a seed layer (e.g., $Y_2O_3$), and an MgO layer which are stacked sequentially. The IBAD layer 2 is formed by an IBAD method. In addition, an epitaxially grown homoepiMaO layer may be formed on the IBAD layer 2. A buffer layer 3 may be formed on the IBAD layer 2. The buffer layer 3 may include $LaMnO_3$, $LaAlO_3$ or $SrTiO_3$, etc. The buffer layer 3 may be formed by a sputtering method. The IBAD layer 2 and the buffer layer 3 can prevent a reaction between the substrate and the superconductor material on the substrate and transfer crystalline properties of the biaxially aligned textured structure.

A superconducting layer 4 is formed on the buffer layer 3. The forming of the superconducting layer 4 may include forming a superconducting precursor film, and heat-treating the superconducting precursor film.

It may be understood that the superconducting precursor film is in an amorphous state that has not been subject to crystallization. The superconducting precursor film may include at least one of rare earth (RE) elements, copper (Cu), and barium (Ba). The superconducting precursor film may be formed by various methods. For example, the superconducting precursor film may be formed by a reactive co-evaporation method, a laser ablation method, a chemical vapor deposition (CVD) method, a metal organic deposition (MOD) method, or a sol-gel method.

In an exemplary embodiment, the superconducting precursor film may be formed by the evaporation method. For depositing the superconducting precursor film, the evaporation method may include providing metal vapor generated by irradiating electron beam onto crucibles which contain rare earth element, copper (Cu) and barium (Ba), respectively. The rare earth element may include at least one of yttrium (Y), elements in the lanthanide series, or a combination thereof. The elements in the lanthanide series include lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

In another exemplary embodiment, the superconducting precursor film 50 may be formed by the MOD method. For example, a metal precursor solution is prepared by dissolving rare earth element-acetate, barium-acetate and copper-acetate in a solvent, evaporating and distilling the dissolved solution, and refluxing the distilled vapor. The metal precursor solution may be coated on the substrate The substrate 1 on which the superconducting precursor film is formed is heat-treated, so that a superconducting layer 4 epitaxially grows on the substrate 1.

A protecting layer 5 is formed on the superconducting layer 4. The protecting layer 5 may be formed of silver (Ag). The protecting layer 5 may protect the superconducting layer 4 from an external environment.

Figure 3A:
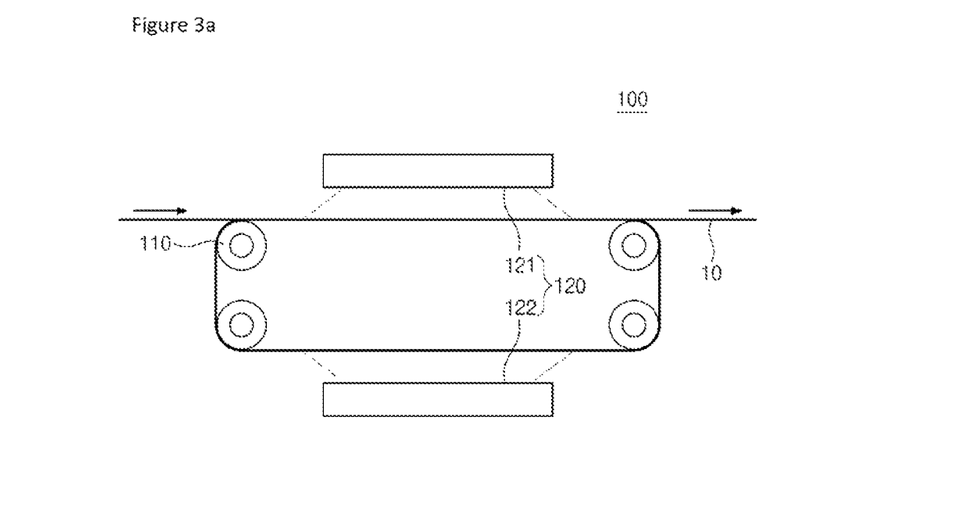
FIG. 3A is a schematic view conceptually illustrating a copper protecting layer forming unit according to an embodiment of the inventive concept.
Figure 3B:
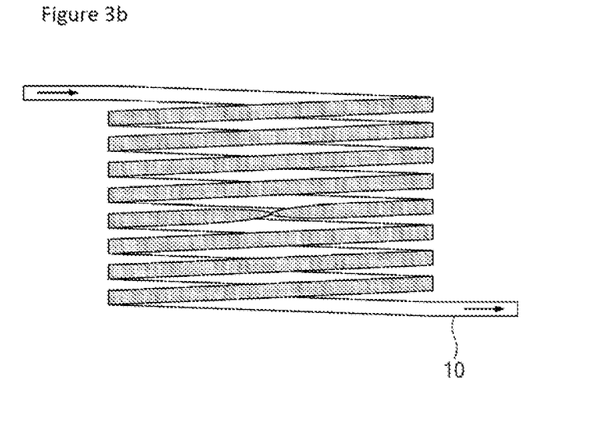
FIG. 3B illustrates a superconducting tape provided to a copper protecting layer forming unit according to an embodiment of the inventive concept.
Figure 4:
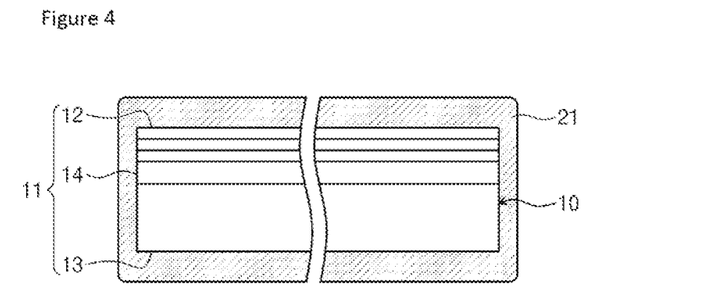
FIG. 4 is a schematic view illustrating that a copper protecting layer is formed on a superconducting tape according to an embodiment of the inventive concept.

FIG. 3A is a schematic view conceptually illustrating a copper protecting layer forming unit 100 according to an embodiment of the inventive concept, and FIG. 3B illustrates a superconducting tape provided as the copper protecting layer forming unit 100. FIG. 4 illustrates that a copper protecting layer 21 is formed on a superconducting tape.

Referring to FIGS. 3A and 3B, the copper protecting layer forming unit 100 may include a first reel to reel apparatus 110, and a deposition member 120. The deposition member 120 is provided within a process chamber (not illustrated). The process chamber may provide a space in which a deposition process of forming the copper protecting layer on the superconducting tape 10 is performed, and may also provide a pressure (e.g., a pressure less than a few Torr) less than the atmospheric pressure.

The deposition member 120 may include first and second deposition members 121 and 122 provided with the first reel to reel apparatus 110 in-between. In an exemplary embodiment, the first and second deposition members 121 and 122 may form the copper protecting layer 21 using a physical deposition method (e.g., sputtering) on the superconducting tape 10. For example, the first and second deposition members 121 and 122 may be sputtering targets, respectively. The superconducting tape 10 may be twisted by the first reel to reel apparatus 120. Thus, the copper protecting layer 21 may be formed on both the first surface 12 and the second surface 13. Further, the copper protecting layer 21 may be formed on both side surfaces connecting the first surface 12 and the second surface 13. The copper protecting layer 21 may have a thickness ranging from approximately 0.5 mm to approximately 4.0 mm. The copper protecting layer 21 may be formed thinner on the side surfaces 14 than on the first surface 12 and the second surface 13 (see FIG. 4).

Figure 5:
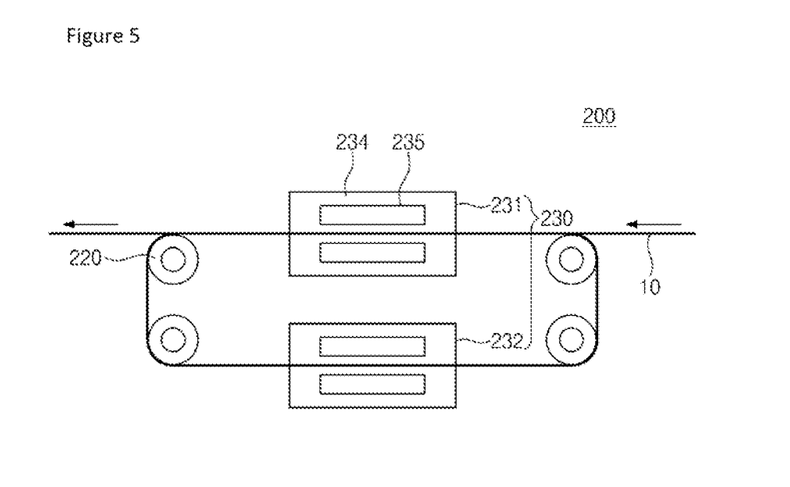
FIG. 5 is a schematic view conceptually illustrating a copper stabilizing layer forming unit according to an embodiment of the inventive concept.
Figure 6:
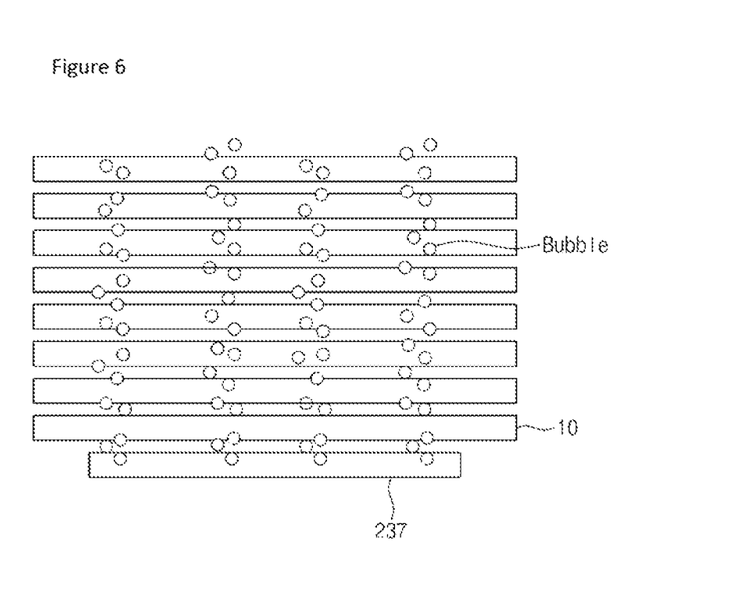
FIG. 6 is a schematic view conceptually illustrating a bubbling apparatus of a copper stabilizing layer forming unit according to an embodiment of the inventive concept.

FIG. 5 is a schematic view conceptually illustrating a copper stabilizing layer forming unit 200 according to an embodiment of the inventive concept. FIG. 6 illustrates that a copper protecting layer 22 is formed on the superconducting tape.

Referring to FIG. 5, the copper stabilizing layer forming unit 200 may include a second reel to reel apparatus 220, and a plating member 230. The plating member 230 may include first and second plating members 231 and 232. In an exemplary embodiment, the first and second plating members 231 and 232 may include a positive electrode 235 dipped in a plating solution 234 in which copper(II) sulfate pentahydrate and sulfuric acid are mixed. The positive electrode 235 may be phosphorous-containing copper. The superconducting tape 10 is provided in the plating solution of the first and second plating members 231 and 232. The superconducting tape 10 is charged to a negative electrode. Generally, the superconducting tape 10 may be damaged by the plating solution 234 containing sulfuric acid and/or a cleaning process. According to the inventive concept, the copper protecting layer 21 may prevent the superconducting tape 10 from being damaged by the plating solution 234 and/or the cleaning process.

Furthermore, hydrogen ions contained in the plating solution 234 may remain on the superconducting tape 10. Those hydrogen ions may damage the superconducting tape 10. Therefore, it is preferable that the hydrogen ions be removed during and/or after the formation of the copper stabilizing layer 22. Various methods may be used for removing the hydrogen ions.

In an exemplary embodiment, the amount of hydrogen ions remaining on the superconducting tape 10 may be decreased by supplying bubbles of oxygen, nitrogen or air from bottoms of the first and second plating members 231 and 232 (see FIG. 6). FIG. 6 illustrates that bubbles of oxygen, nitrogen or air are supplied from a bubbler 237 under the positive electrode 235 dipped in the plating solution 234. The bubbles of oxygen, nitrogen or air rise to a top surface of the plating solution 234 through the surface of the superconducting tape 10.

In an exemplary embodiment, instead of general sulfuric acid, electrolyzed sulfuric acid is used as the sulfuric acid. A process of preparing electrolyzed sulfuric acid is described. Referring to the following reaction formula, a sulfuric acid solution in which sulfuric acid and water are mixed is electrolyzed.

In the inventive concept, it may be understood that the electrolyzed sulfuric acid includes $SO_4^{2-}$. Ionized hydrogen (e.g., $H^+$) which is generated when sulfuric acid is electrolyzed may be converted into $H_2$ and removed. For example, ionized hydrogen may be removed in the form of hydrogen gas ($H_2$) near the negative electrode.

In an exemplary embodiment, the plated superconducting tape 10 is baked. The backing process may be performed at a pressure ranging from $10^{-6}$ torr to atmospheric pressure and a temperature not less than room temperature. The baking process may be performed, for example, at a pressure of approximately 1 mtorr and approximately 200▢. By the baking process, hydrogen remaining on the superconducting tape 10 may be removed.

Figure 7:
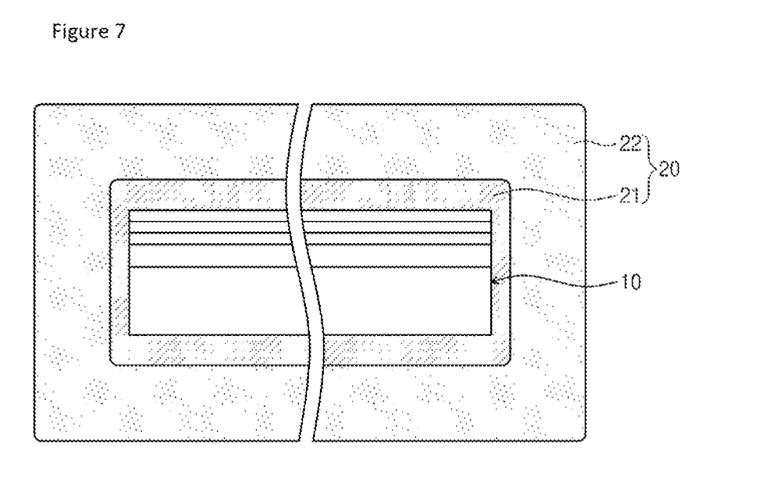
FIG. 7 is a schematic view illustrating that a copper stabilizing layer is formed on a superconducting tape according to an embodiment of the inventive concept.

Referring to FIG. 7, the copper stabilizing layer 22 is electroplated on the copper protecting layer 21. The copper protecting layer 21 may function as a seed layer for electroplating of the copper stabilizing layer 22. The copper stabilizing layer 22 may be uniformly formed on the first surface, the second surface and the side surfaces of the superconducting tape 10. The copper protecting layer 23 may have a thickness ranging from approximately 15 mm to approximately 20 mm.

The copper layer 20 may include the copper protecting layer 21 and the copper stabilizing layer 22 on the copper protecting layer 21. The copper layer 20 completely surrounds the outer surface 11 of the superconducting tape 10 to encapsulate the superconducting tape 10. Thus, the superconducting tape 10 can be stably protected. According to the exemplary embodiments of the inventive concept, the copper layer may be more densely formed to stably protect the superconducting tape from penetration of an external gas or a harmful material.

Figure 8:
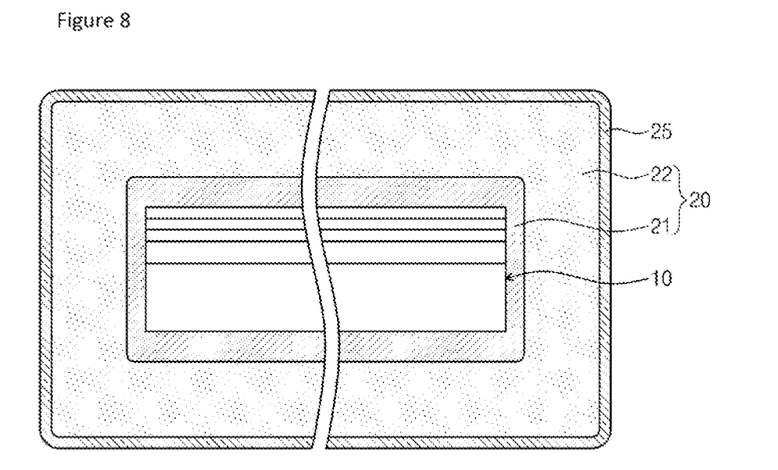
FIG. 8 is a schematic view illustrating that an oxidation preventing film is formed on a superconducting tape according to an embodiment of the inventive concept.

Referring to FIG. 8, an oxidation preventing layer 25 covering the copper layer 25 may be further formed. The forming of the oxidation preventing layer 25 may include a chromate treatment. The chromate treatment allows a thin film having chromium chromate as a main component to be formed on the copper layer. The thin film is formed by a main reaction in which copper is dissolved by acid in a solution having chromic acid or dichromate as a main component coating and hydrogen ion concentration in a grain boundary of copper is reduced so as to reduce dichromate ions, etc. Thus, a deposit is formed on a copper surface and a chromate film having complex components is formed. When the chromate film is dried to remove moisture, it becomes a hard film having fine cracks. This oxidation preventing layer 25 may be a chromium-containing film. Unlike this, the oxidation preventing layer 25 may be a silicate-based inorganic compound film. The silicate-based inorganic compound film may include, for example, a lithium compound, a silicon compound, and additives. At least a portion of the silicate-based inorganic compound film may be removed according to the need of a subsequent process.

The oxidation preventing layer 25 can prevent a surface of the copper layer 20 from being oxidized and thus a contact resistance between the copper layer 20 and another wire contacting the copper layer 20 from being increased. Although the oxidation preventing layer 25 is not illustrated in the drawings mentioned below, the oxidation preventing layer 25 may exist on the copper layer 20 according to the inventive concept.

In the description and claims below, the superconducting tape 10 on which the copper layer 20 is formed may be referred to as the superconducting tape 10. To this end, one side 20*a* of the copper layer 20 covering the superconducting tape 10 is on the one side surface 14*a* of the superconducting tape 10, and the other side 20*b* of the copper layer 20 covering the superconducting tape 10 is on the other side surface 14*b* of the superconducting tape 10. Further, in case the oxidation preventing layer 25 exists, one side 20*a* and the other side 20*b* of the copper layer may indicate one side and the other side of the oxidation preventing layer 25, respectively.

Figure 9:
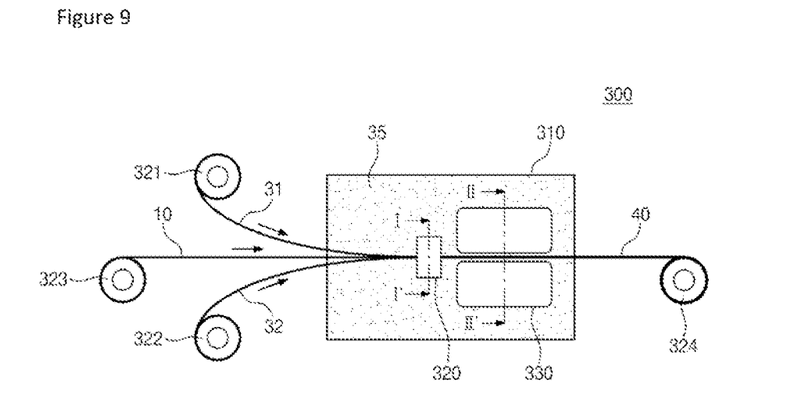
FIG. 9 is a schematic view conceptually illustrating a lamination unit according to an embodiment of the inventive concept.
Figure 10A:
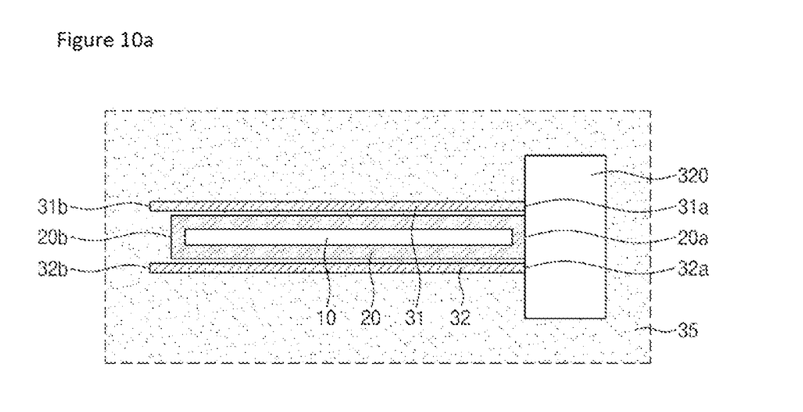
FIGS. 10A and 10B are cross-sectional views taken along lines I-I? and II-II? of FIG. 9, respectively.
Figure 10B:
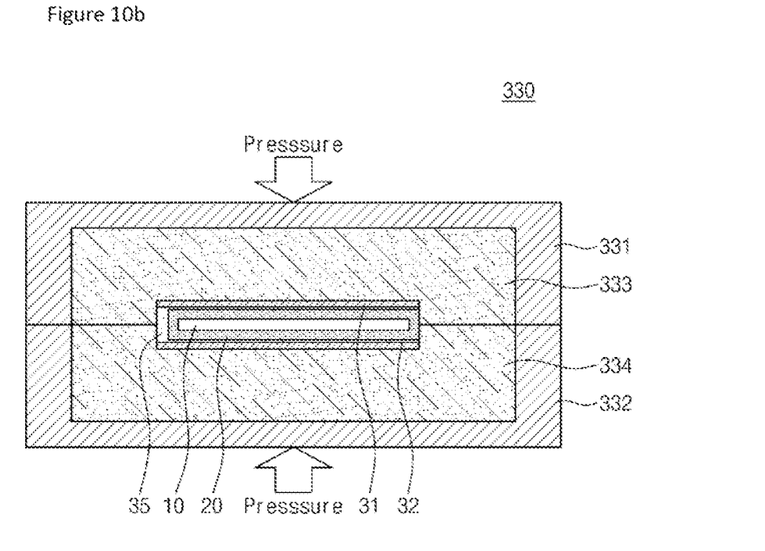

FIG. 9 is a schematic view conceptually illustrating a lamination unit 300 according to an embodiment of the inventive concept. FIGS. 10A and 10B are cross-sectional views taken along lines I-I? and II-II? of FIG. 9 and viewed from where the superconducting tape 10, the first and second metal tapes 31 and 32 are introduced.

Referring to FIGS. 9, 10A and 10B, the lamination unit 300 may include a solder port 310, a third reel to reel apparatus, and a pressing member 330.

The solder port 310 contains a solder 35 therein. The solder 35 may include tin (62%), lead (36%), and/or silver (2%).

The third reel to reel apparatus may include first and second reel members 321 and 322 providing first and second metal tapes 31 and 32, a third reel member 323 providing a superconducting tape 10, and a fourth reel member 324 winding a superconducting wire 40. The third reel member 323 provides the superconducting tape 10 between the first and second metal tapes 31 and 32 fed from the first reel member 321 and the second reel member 322. The superconducting tape 10, and the first and second metal tapes 31 and 32 are dipped in the solder 35 of the solder port 310 to keep the solder 35 therein, become the superconducting wire 40, and the superconducting wire 40 is provided to the fourth reel member 324. The solder 35 is provided between the first metal tape 31 and the first surface of the superconducting tape 10, and between the second metal tape 32 and the second surface of the superconducting tape 10. The first and second metal tapes 31 and 32 may have a thickness ranging from approximately 40 mm to approximately 120 mm. The first and second metal tapes 31 and 32 may include a metal or a metal alloy. The first and second metal tapes 31 and 32 may include, for example, stainless steel, copper, aluminum, nickel, or an alloy thereof.

A guide member 320 may be provided in front of the pressing member 330. The guide member 320 guides the superconducting tape 10 inserted between the first and second metal tapes 31 and 32 to the pressing member 330. The guide member 320 allows one side 20*a* of the copper layer on the one side surface 14*a* of the superconducting tape 10 and one sides 31*a* and 32*a* of the first and second metal tapes 31 and 32 to be aligned with each other. For example, the guide member 320 allows one side 20*a* of the copper layer on the one side surface 14*a* of the superconducting tape 10 and one sides 31*a* and 32*a* of the first and second metal tapes 31 and 32 to contact the guide member 320. Thus, the first and second metal tapes 31 and 32 completely cover the first surface 12 and the second surface 13 of the superconducting tape 10 on which the copper layer is formed. Thus, the first surface 12 and the second surface 13 of the superconducting tape 10 on which the copper layer 20 is formed can be stably protected. Further, in case widths of the first and second metal tapes 31 and 32 are greater than the width of the superconducting tape 10 on which the copper layer 20 is formed, the other sides 31*b* and 32*b* of the first and second metal tapes may protrude from the other side 20*b* of the copper layer 20 on the other side surface 14*b* of the superconducting tape 10. If the guide member 320 is not provided, the superconducting tape 10 may not be aligned with the first and second metal tapes 31 and 32. For example, the superconducting tape 10 may deviate from at least one side of the first and second metal tapes 31 and 32.

The pressing member 330 is provided inside the solder port 310 between the first to third reel members 321, 322, 323, and the fourth reel member 324. The pressing member 330 may include one pair of pressing member main bodies 331 and 332, and one pair of elastic bodies (e.g., silicon rubber) 334 and 335 therebetween. The pressing member 330 presses the superconducting tape 10 and the first and second metal tapes 31 and 32 to attach the superconducting tape 10, the first metal tape 31 and the second metal tape 32. Together with this, the pressing member 330 removes unnecessary solder residue on the one side surface 14a and/or the other side surface 14b of the superconducting tape 10 on which the copper layer 20 is formed such that the solder 35 is left between the first surface 12 of the superconducting tape 10 and the first metal tape 31, and between the second surface 13 of the superconducting tape 10 and the second metal tape 32. The removed solder residue may be withdrawn to the solder port 310 and reused.

Figure 11A:
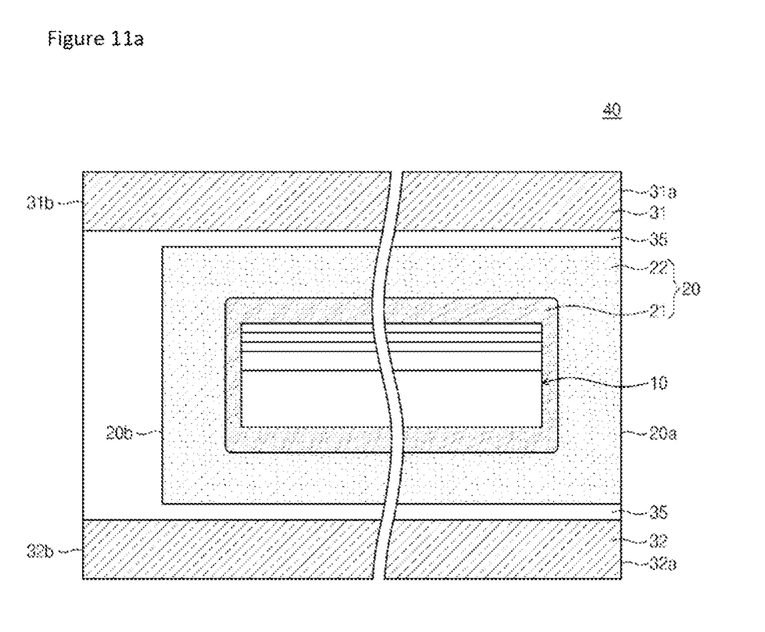
FIGS. 11A and 11B are schematic views illustrating superconducting wires on which metal tapes are attached according to embodiments of the inventive concept.
Figure 11B:
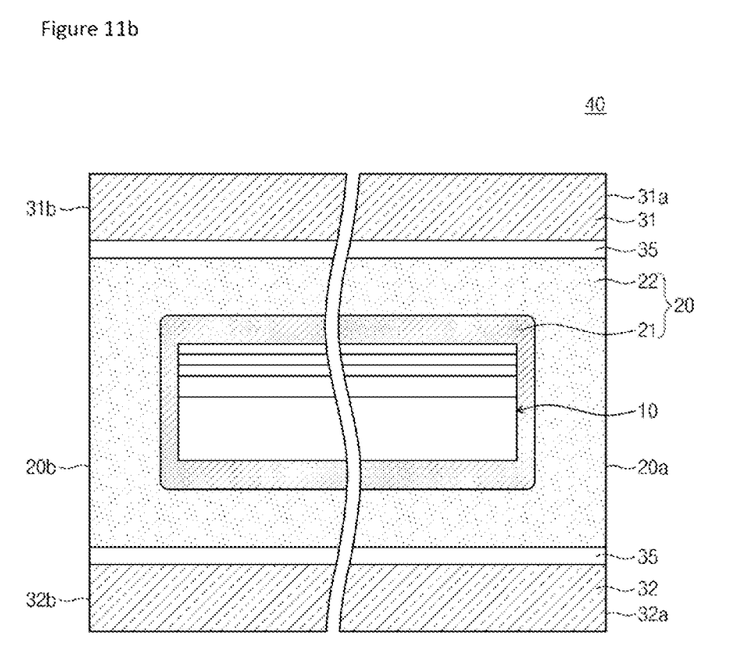

FIGS. 11A and 11B illustrate a superconducting wire 40 having metal tapes 31 and 32 attached on both surfaces thereof.

Referring to FIGS. 2 and 11A, the superconducting wire 40 according to an exemplary embodiment of the inventive concept includes a superconducting tape 10, a copper layer 20 on an outer surface of the superconducting tape 10, first and second metal tapes 31 and 32 respectively attached on a first surface 12 and a second surface 13 of the superconducting tape 10 on which the copper layer 20 is formed, and a solder 35 between the first surface 12 of the superconducting tape 10 and the first metal tape 31, and between the second surface 13 of the superconducting tape 10 and the second metal tape 32. The outer surface 11 of the superconducting tape 10 is defined by the first surface 12, the second surface 13 opposing the first surface 12, and both side surfaces connecting the first surface 12 and the second surface 13.

The thickness of the solder 35 on one side surface 14a of the superconducting tape 10 on which the copper layer 20 is formed may be different from that on the other side surface 14b of the superconducting tape 10 on which the copper layer 20 is formed. For example, the thickness of the solder 35 on one side surface 14a of the superconducting tape 10 on which the copper layer 20 is formed may be thinner than that on the other side surface 14b of the superconducting tape 10 on which the copper layer 20 is formed. Furthermore, the solder 35 may be substantially removed from the one side surface 14a of the superconducting tape 10 on which the copper layer 20 is formed, and may remain between the other sides 31b and 32b and the other side 20b of the copper layer 20 on the other side surface 14b of the superconducting tape 10. FIG. 11A illustrates a case where widths of the first metal tape 31 and the second metal tape 32 are greater than the width of the superconducting tape 10 on which the copper layer 20 is formed.

Referring to FIGS. 2 and 11B, in another exemplary embodiment of the inventive concept, the solder 35 may be substantially removed from the one side surface 14a and the other side surface 14b of the superconducting tape 10 on which the copper layer 20 is formed. The solder 35 may remain between the first surface 12 of the superconducting tape 10 and the first metal tape 31 and between the second surface 13 of the superconducting tape 10 and the second metal tape 32. FIG. 11B illustrates a case where widths of the first metal tape 31 and the second metal tape 32 are equal to the width of the superconducting tape 10 on which the copper layer 20 is formed.

The invention claimed is:

1. A method of manufacturing a superconducting wire, comprising:
    providing a superconducting tape having an outer surface defined by a first surface, a second surface opposing the first surface, and both side surfaces connecting the first surface and the second surface;
    forming a copper layer on the outer surface of the superconducting tape; and
    respectively attaching a first metal tape and a second metal tape on the first surface and the second surface of the superconducting tape on which the copper layer is formed,
    wherein the forming of the copper layer comprises:
    forming a copper protecting layer using a physical deposition method so as to cover the first surface, the second surface and the side surfaces; and
    forming a copper stabilizing layer on the copper protecting layer using an electroplating method.

2. The method of claim 1, wherein the copper protective layer is formed by a sputtering process, and the superconducting tape is twisted during the sputtering process such that the copper protective layer completely covers the first surface, the second surface and the side surfaces of the superconducting tape.

3. The method of claim 2, wherein the copper protecting layer is formed thinner on the both side surfaces than on the first surface and the second surface.

4. The method of claim 1, wherein the forming of the copper stabilizing layer comprises separating hydrogen ions generated in the electroplating method.

5. The method of claim 4, wherein the electroplating method uses an electrolyzed sulfuric acid solution.

6. The method of claim 4, wherein the forming of the copper stabilizing layer comprises baking the superconducting tape.

7. The method of claim 4, wherein the electroplating method comprising supplying bubbles of oxygen, nitrogen, or air from a bottom of a plating member for electroplating.

8. The method of claim 1, further comprising forming an oxidation preventing layer on the copper layer.

9. The method of claim 8, wherein the oxidation preventing layer is a chromium-containing film or a silica-based inorganic compound film.

10. The method of claim 1, wherein the metal tapes comprise stainless steel, copper, aluminum, nickel or alloys thereof.

11. The method of claim 1, wherein the attaching of the first metal tape and the second metal tape comprises providing a solder between the metal tapes and the superconducting tape on which the copper layer is formed.

12. The method of claim 11, wherein the attaching of the first metal tape and the second metal tape comprises:
    providing the superconducting tape on which the copper layer is formed and the metal tapes between one pair of elastic bodies facing each other; and
    pressing the elastic bodies to remove a residue of the solder.

13. The method of claim 11, further comprising aligning one side of the copper layer on one side surface of the superconducting tape with one sides of the first and second metal tapes, before the attaching of the first and second metal tapes on the superconducting tape on which the copper layer is formed.

14. The method of claim 13, wherein the thickness of the solder on the one side surface of the superconducting tape on which the copper layer is formed is different from that on the other side surface of the superconducting tape on which the copper layer is formed.

15. The method of claim 14, wherein the thickness of the solder on the one side surface is thinner than that on the other side surface.

16. The method of claim 13, wherein the other sides of the first and second metal tapes protrude from the other side of the copper layer on the other side surface of the superconducting tape.

17. A method of manufacturing a superconducting wire, comprising:
- providing a superconducting tape having an outer surface defined by a first surface, a second surface opposing the first surface, and both side surfaces connecting the first surface and the second surface;
- covering a copper layer on the outer surface of the superconducting tape; and
- providing the superconducting tape covered with the copper layer between a first metal tape and a second metal tape;
- aligning one side of the copper layer on one side surface of the superconducting tape with one sides of the first and second metal tapes; and
- attaching the first metal tape and the second metal tape on a first surface and a second surface of the superconducting tape covered with the copper layer, respectively.

18. The method of claim 17, wherein the thickness of the solder on the one side surface of the superconducting tape covered with the copper layer is formed thinner than that on the other side surface of the superconducting tape covered with the copper layer.

19. The method of claim 18, wherein the other sides of the first and second metal tapes are formed so as to protrude from the other side of the copper layer on the other side surface of the superconducting tape.

20. A superconducting wire comprising:
- a superconducting tape having an outer surface defined by a first surface, a second surface opposing the first surface, and both side surfaces connecting the first surface and the second surface;
- a copper layer covering the outer surface of the superconducting tape;
- first and second metal tapes attached on the first surface and the second surface of the superconducting tape covered with the copper layer, respectively; and
- a solder between the first surface of the superconducting tape and the first metal tape, and between the second surface of the superconducting tape and the second metal tape,
- wherein the thickness of the solder on one side surface of the superconducting tape is different from that on the other side surface of the superconducting tape.

21. The superconducting wire of claim 20, wherein the thickness of the solder on the one side surface is thinner than that on the other side surface.

22. The superconducting wire of claim 20, wherein the other sides of the first and second metal tapes protrude from the other side of the copper layer on the other side surface of the superconducting tape.

23. The superconducting wire of claim 20, wherein one side of the copper layer on one side surface of the superconducting tape is aligned with one sides of the first and second metal tapes.

24. The superconducting wire of claim 20, further comprising an oxidation preventing layer.

* * * * *